(12) United States Patent
Xiao

(10) Patent No.: US 11,652,558 B2
(45) Date of Patent: May 16, 2023

(54) SIGNAL PROCESSING SYSTEM AND TERMINAL DEVICE

(71) Applicant: VIVO MOBILE COMMUNICATION CO., LTD., Guangdong (CN)

(72) Inventor: Guokun Xiao, Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 112 days.

(21) Appl. No.: 17/383,261

(22) Filed: Jul. 22, 2021

(65) Prior Publication Data

US 2021/0351850 A1    Nov. 11, 2021

Related U.S. Application Data

(63) Continuation-in-part of application No. PCT/CN2020/071683, filed on Jan. 13, 2020.

(30) Foreign Application Priority Data

Jan. 25, 2019   (CN) .......................... 201910072933.4

(51) Int. Cl.
*H04B 1/00*       (2006.01)
*H04B 15/02*      (2006.01)
(Continued)

(52) U.S. Cl.
CPC .......... *H04B 15/02* (2013.01); *H04M 1/0264* (2013.01); *H04M 1/0266* (2013.01); *H04N 23/57* (2023.01)

(58) Field of Classification Search
CPC ........ H04B 15/02; H04B 1/7097; H04B 1/71; H04B 1/7103; H04B 1/715; H04M 1/0266; H04M 1/0274; H04M 1/0277
See application file for complete search history.

(56) References Cited

U.S. PATENT DOCUMENTS 6,424,234 B1 *  7/2002 Stevenson ............ A61N 1/3752
                                                333/182
11,205,834 B2 * 12/2021 Ayala Vazquez ........ H01Q 9/42
(Continued)

FOREIGN PATENT DOCUMENTS

CN      101252218 A     8/2008
CN      103475384 A    12/2013
(Continued)

OTHER PUBLICATIONS

International Search Report and Written Opinion of the International Searching Authority regarding International Patent Application No. PCT/CN2020/071683, dated Apr. 3, 2020. Translation provided by Bohui Intellectual Property.
(Continued)

*Primary Examiner* — Tuan Pham
(74) *Attorney, Agent, or Firm* — Harness, Dickey & Pierce, P.L.C.

(57) ABSTRACT

A signal processing system includes: an interference source; and a band-stop filter. A first terminal of the band-stop filter is electrically connected to the interference source, a second terminal of the band-stop filter is grounded, and the band-stop filter is configured to filter a baseband signal output by the interference source. The interference source includes a first main board; or the interference source includes a target module and a metal frame used for fastening the target module, and the target module is a display module or a camera module.

8 Claims, 2 Drawing Sheets

(51) Int. Cl.
*H04M 1/02* (2006.01)
*H04N 23/57* (2023.01)

(56) References Cited

U.S. PATENT DOCUMENTS

| | | | |
|---|---|---|---|
| 2009/0034213 A1* | 2/2009 | Tuen | H05K 1/0236 361/748 |
| 2010/0234066 A1 | 9/2010 | Kobayashi et al. | |
| 2013/0169380 A1 | 7/2013 | Tamaki | |

FOREIGN PATENT DOCUMENTS

| | | | |
|---|---|---|---|
| CN | 104994204 | A | 10/2015 |
| CN | 105913814 | A | 8/2016 |
| CN | 107809506 | A | 3/2018 |
| CN | 108923802 | A | 11/2018 |
| CN | 109818684 | A | 5/2019 |
| EP | 1675286 | A1 | 6/2006 |
| JP | 2009253994 | A | 10/2009 |

OTHER PUBLICATIONS

First Office Action regarding Chinese Patent Application No. 201910072933.4, dated Mar. 2, 2020. Translation provided by Bohui Intellectual Property.
Second Office Action regarding Chinese Patent Application No. 201910072933.4, dated Aug. 27, 2020. Translation provided by Bohui Intellectual Property.
Supplementary European Search Report regarding Patent Application No. 20745827.4-1216/3917039; PCT/CN2020/071683, dated Mar. 4, 2022.

* cited by examiner

SIGNAL PROCESSING SYSTEM AND TERMINAL DEVICE

CROSS-REFERENCE TO RELATED APPLICATIONS

This application is a Bypass Continuation-in-part Application of PCT/CN2020/071683, filed on Jan. 13, 2020, which claims priority to Chinese Patent Application No. 201910072933.4 filed on Jan. 25, 2019, which are incorporated herein by reference in their entirety.

TECHNICAL FIELD

Embodiments of the present disclosure relate to the field of communications technologies, and in particular, to a signal processing system and a terminal device.

BACKGROUND

With the rapid development of communications technologies, terminal devices such as a mobile phone and a tablet computer are increasingly used.

SUMMARY

Embodiments of the present disclosure provide a signal processing system and a terminal device.

According to a first aspect, an embodiment of the present disclosure provides a signaling processing system, applied to a terminal device and including:

an interference source; and a band-stop filter, where a first terminal of the band-stop filter is electrically connected to the interference source, a second terminal of the band-stop filter is grounded, and the band-stop filter is configured to filter a baseband signal output by the interference source; where the interference source includes a first main board, or the interference source includes a target module and a metal frame used for fastening the target module, and the target module is a display module or a camera module.

According to another aspect, an embodiment of the present disclosure provides a terminal device, including the foregoing signal processing system.

BRIEF DESCRIPTION OF DRAWINGS

To describe the technical solutions of the embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings.

DESCRIPTION OF EMBODIMENTS

The following clearly describes the technical solutions in the embodiments of the present disclosure with reference to the accompanying drawings in the embodiments of the present disclosure. Apparently, the described embodiments are some rather than all of the embodiments of the present disclosure. Based on the embodiments of the present disclosure, all other embodiments obtained by a person of ordinary skill in the art fall within the protection scope of the present disclosure.

A signal processing system provided in the embodiments of the present disclosure is described below first.

It should be noted that the signal processing system provided in the embodiments of the present disclosure is applied to a terminal device. Optionally, the terminal device may be a computer, a mobile phone, a tablet personal computer, a laptop computer, a personal digital assistant (PDA), a mobile internet device (MID), a wearable device, or the like.

Figure 1:
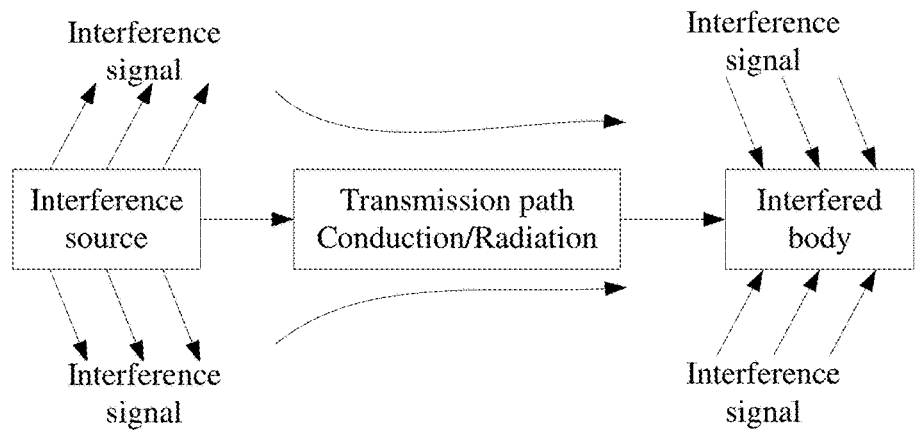
FIG. 1 is a principle diagram of radiation interference.

As shown in FIG. 1, there are often some interference sources in the terminal device. Interference signals generated by these interference sources may reach an interfered body along a transmission path through conduction or radiation, affecting the interfered body, for example, interfering with a radio frequency signal of a local device or interfering with normal running of another device.

For an interference problem, a solution commonly used in a related technology is to add a shielding device to the interference source, for example, attaching conductive cloth or a copper sheet. However, as use time increases, conduction effects of the conductive cloth and the copper sheet become worse, and the interference signals cannot be effectively shielded. Therefore, an effect of the solution is relatively poor.

FIG. 2 to FIG. 5 are schematic structural diagrams of a signal processing system according to an embodiment of the present disclosure. As shown in FIG. 2 to FIG. 5, the signal processing system includes an interference source 1 and a band-stop filter 3.

A first terminal of the band-stop filter 3 is electrically connected to the interference source 1, a second terminal of the band-stop filter 3 is grounded, and the band-stop filter 3 filters a baseband signal output by the interference source 1.

Figure 2:
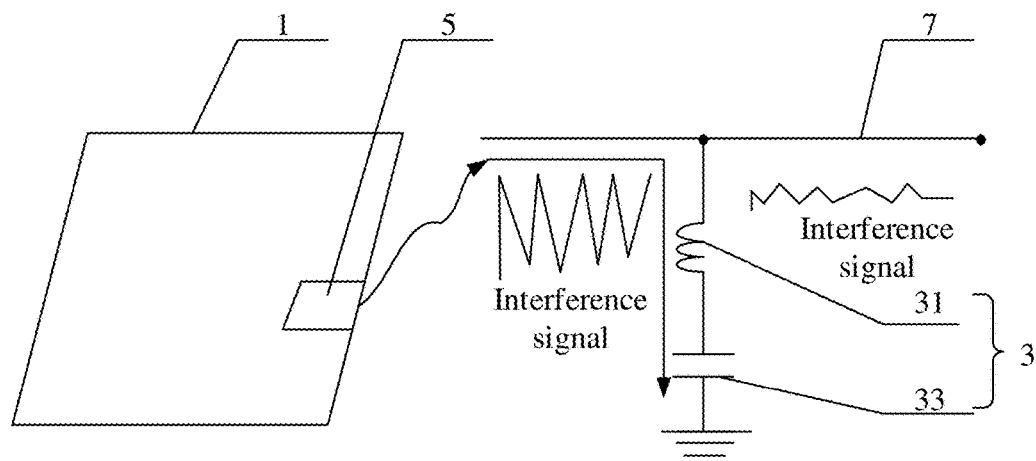
FIG. 2 is a schematic structural diagram 1 of a signal processing system according to an embodiment of the present disclosure.
Figure 4:
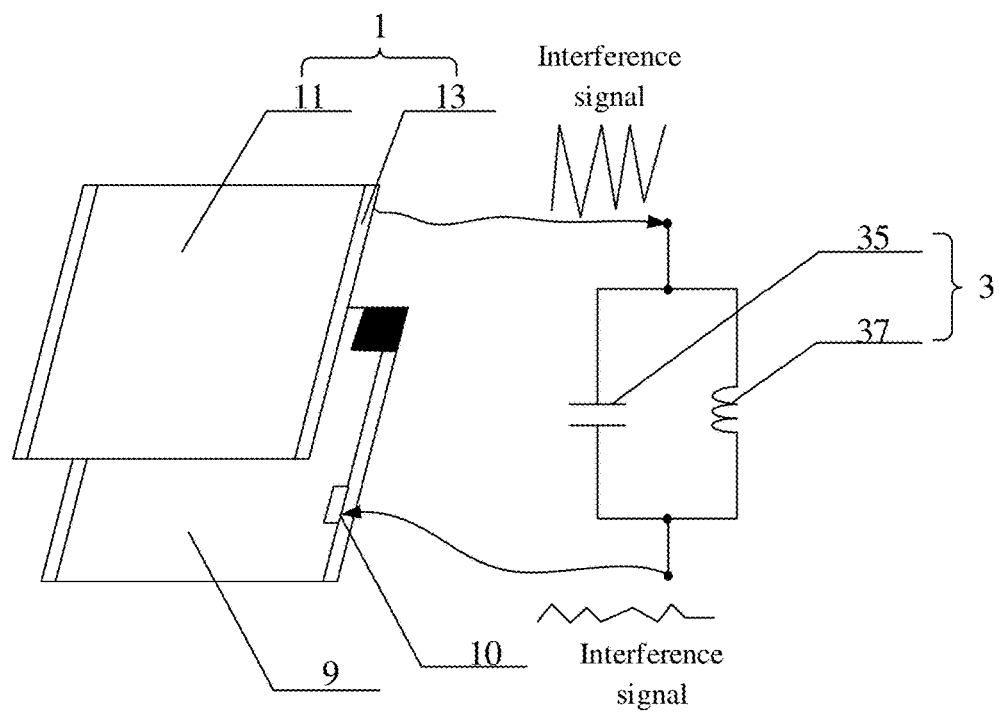
FIG. 4 is a schematic structural diagram 3 of a signal processing system according to an embodiment of the present disclosure.

As shown in FIG. 2, the interference source 1 includes a first main board; or as shown in FIG. 4, the interference source 1 includes a target module 11 and a metal frame 13 used for fastening the target module 11, and the target module 11 is a display module or a camera module.

Herein, the metal frame 13 may be made of a raw material of iron. The display screen module may be a liquid crystal display (LCD) module, and a display in the display screen module may be a thin film transistor (TFT) display.

Optionally, the baseband signal is an original electrical signal that is sent from a signal source and that is not modulated (in other words, spectrum shifting and conversion are not performed). Based on different types of the interference source 1, types of output baseband signals are also different. For clear layout, a type of the baseband signal output by the interference source 1 is described later separately for two cases: The interference source 1 includes the first main board, and the interference source 1 includes the target module 11 and the metal frame 13.

It should be noted that there is usually an interference signal in the baseband signal output by the interference source 1. The interference source 1 may also be referred to as a noise source, the interference signal may also be referred to as noise, and an interfered body 4 in FIG. 3 and FIG. 5 may also be referred to as a noise acceptor.

In the signal processing system provided in this embodiment of the present disclosure, the first terminal of the band-stop filter 3 is electrically connected to the interference source 1, and the second terminal of the band-stop filter 3 is grounded. The interference source 1 includes the first main board, or the interference source 1 includes the target module 11 and the metal frame 13. It should be noted that the band-stop filter 3 (which is opposite to a concept of a band-pass filter) is a filter that can attenuate frequency components in some ranges to an extremely low level by using most frequency components. In this way, when the band-stop filter 3 filters the baseband signal output by the interference source 1, the band-stop filter 3 can attenuate the interference signal in the baseband signal output by the interference source 1 to an extremely low level (for an attenuation effect, refer to comparison between two waveforms in any one of FIG. 2 to FIG. 5), to effectively weaken interference caused by the interference source 1 to the interfered body 4. It can be learned that, in this embodiment of the present disclosure, the band-stop filter 3 is disposed, so that an interference problem caused by the first main board used as the interference source 1 can be resolved, or an interference problem caused by the interference source 1 including the target module 11 and the metal frame 13 can be resolved. In addition, even when use time increases, the band-stop filter 3 can also maintain a good filtering effect. Therefore, compared with a solution in a related technology of attaching conductive cloth or a copper sheet, this embodiment of the present disclosure can resolve the interference problem more effectively.

Optionally, as shown in FIG. 2, in a case where the interference source 1 includes the first main board, the first terminal of the band-stop filter 3 is electrically connected to an electronic element interface 5 of the first main board, and the band-stop filter 3 filters a clock (CLK) signal output by the electronic element interface 5.

It is easy to learn that the interference source 1 of the main board outputs a baseband signal of a type such as the CLK signal. Herein, the first main board may be a printed circuit board (PCB) main board.

Optionally, the electronic element interface 5 may be electrically connected to a corresponding electronic element (not shown in the figure) by using a connection cable 7, and the first main board may provide a clock signal to the electronic element by using the connection cable 7, to ensure normal running of the electronic element. Optionally, the first terminal of the band-stop filter 3 may be connected to the connection cable 7.

Optionally, the electronic element interface 5 may be a secure digital (SD) card interface. Certainly, a type of the electronic element interface 5 is not limited to an SD card interface. Correspondingly, an electronic element to which the electronic element interface 5 is electrically connected by using the connection cable 7 is not limited to an SD card. The electronic element interface 5 may be alternatively electrically connected, by using the connection cable 7, to another electronic component that is in a terminal device and for which the first main board needs to provide the CLK signal.

It should be noted that there is usually a low-frequency harmonic component (for example, a third harmonic component or a fifth harmonic component) in the CLK signal output by the first main board through the electronic element interface 5. If the low-frequency harmonic component is not processed, the low-frequency harmonic component is used as noise to cause radiation interference to another device around the terminal device, and the terminal device cannot pass electro magnetic compatibility (EMC) authentication of the European Union standard and a radiated emission (RE) test in Federal Communications Commission (FCC) authentication.

In view of this, in this embodiment, the first terminal of the band-stop filter 3 may be electrically connected to the electronic element interface 5 of the first main board, and the band-stop filter 3 can attenuate the low-frequency harmonic component that is in the CLK signal and that is used as the noise to an extremely low level, thereby effectively weakening the radiation interference caused by the noise to the another device around the terminal device, to ensure that the terminal device passes the RE test as far as possible.

Optionally, the band-stop filter 3 is a notch filter.

It may be understood that the notch filter is a filter that can rapidly attenuate an input signal at a frequency point to prevent a signal at this frequency from passing through. The notch filter is a band-stop filter of a possible type, and a band of the notch filter is very narrow.

With reference to FIG. 2, the electronic element interface 5 is electrically connected to the electronic element by using the connection cable 7, and the first terminal of the band-stop filter 3 is connected to the connection cable 7. To ensure normal running of the electronic element, remaining components in the CLK signal except the low-frequency harmonic component used as the noise need to be normally transmitted to the electronic element through the connection cable 7. In this case, it is required to ensure as far as possible that the remaining components in the CLK signal are not affected by the band-stop filter 3.

In view of this, in this embodiment, a notch filter may be selected as the band-stop filter 3. In this way, the band-stop filter 3 can act only on the low-frequency harmonic component used as the noise, but not as the remaining component in the CLK signal. In this way, an electronic device can normally run based on a signal received through the connection cable 7.

Figure 3:
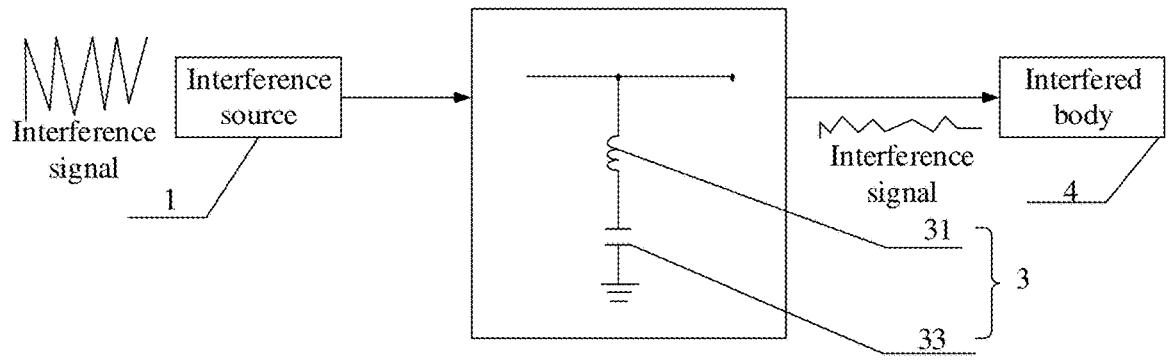
FIG. 3 is a schematic structural diagram 2 of a signal processing system according to an embodiment of the present disclosure.

Optionally, as shown in FIG. 2 and FIG. 3, the band-stop filter 3 includes a first inductor 31 and a first capacitor 33. A first terminal (an upper terminal shown in FIG. 2 and FIG. 3) of the first inductor 31 is electrically connected to the electronic element interface 5, a first terminal d (an upper terminal shown in FIG. 2 and FIG. 3) of the first capacitor 33 is electrically connected to a second terminal (a lower terminal shown in FIG. 2 and FIG. 3) of the first inductor 31, and a second terminal (a lower terminal shown in FIG. 2 and FIG. 3) of the first capacitor 33 is grounded (ground herein may be represented by GND).

It can be easily learned that the first inductor 31 and the first capacitor 33 are connected in series, an upper terminal of the first inductor 31 is used as the first terminal of the band-stop filter 3, and a lower terminal of the first capacitor 33 is used as the second terminal of the band-stop filter 3.

Optionally, cut-off frequency of the band-stop filter 3 may be calculated by using the following formula:

$$F = \frac{1}{2\pi\sqrt{LC}}.$$

F is the cut-off frequency of the band-stop filter 3, L is a inductance value of the first inductor 31, and C is a capacitance value of the first capacitor 33.

Therefore, by selecting the first inductor 31 with a proper inductance value and the first capacitor 33 with a proper capacitance value, the band-stop filter 3 can effectively act on the low-frequency harmonic component that is in the CLK signal and that is used as the noise. Optionally, the inductance value of the first inductor 31 may be greater than or equal to 1 nH and less than or equal to 200 nH, and the capacitance value of the first capacitor 33 may be greater than or equal to 0.1 pF and less than or equal to 100 pF.

The inductance value of the first inductor 31 may be 1 nH, 50 nH, 100 nH, 150 nH, or 200 nH, and the capacitance value of the first capacitor 33 is 0.1 pF, 1 pF, 10 pF, 50 pF, or 100 pF. Certainly, the inductance value of the first inductor 31 and the capacitance value of the first capacitor 33 are not limited to the foregoing enumerated cases. The inductance value of the first inductor 31 and the capacitance value of the first capacitor 33 may be properly selected based on an actual requirement. It is only required to ensure that the band-stop filter 3 can effectively act on the low-frequency harmonic component that is in the CLK signal and that is used as the nose. Cases are not listed one by one herein.

Optionally, there are three ideas to resolve a radiation interference problem: Idea 1: Clear the noise at the interference source. For example, as mentioned in the background, a shielding apparatus is added at the interference source. Idea 2: Cut off a transmission path. For example, a grounding point is added on an output path, and the noise is introduced into another reference ground plane or is absorbed. Idea 3: Add a shielding apparatus to the interfered body. For example, a shielding cover is added for protection. However, a transmission path of the noise varies, and the interfered body cannot be shielded in some cases. For example, the noise may interfere with an antenna, and the antenna is a radiator and cannot be shielded. Therefore, it is an optimal solution to clear the noise at the interference source.

In this embodiment, for the baseband signal such as the CLK signal, the band-stop filter 3 is added, so that most noise (to be specific, the low-frequency harmonic component in the CLK signal) can be evacuated to the GND. In this way, radiation interference can be greatly reduced from the interference source 1, thereby effectively resolving the interference problem. In addition, a structure of the band-stop filter 3 is very simple, costs are very low, and it is very convenient to install the band-stop filter 3.

Optionally, as shown in FIG. 4, in a case where the interference source 1 includes the target module 11 and the metal frame 13, the first terminal of the band-stop filter 3 is electrically connected to the metal frame 13, and the band-stop filter 3 filters a display signal or a camera signal output by the metal frame 13.

It can be easily learned that, the interference source 1 including the target module 11 and the metal frame 13 outputs a baseband signal of a type such as the display signal or the camera signal.

It should be noted that, in many cases, a display signal (or a camera signal) that is used as noise is generated on the target module 11. After the noise is conducted by using the metal frame 13, the noise may very likely cause interference to a radio frequency signal of the terminal device, thereby deteriorating performance of the radio frequency signal.

In view of this, in this embodiment, the first terminal of the band-stop filter 3 may be electrically connected to the metal frame 13, and the band-stop filter 3 can attenuate the noise to an extremely low level, thereby effectively resolving an interference problem caused by the interference source 1 to the radio frequency signal of the terminal device. In addition, because the second terminal of the band-stop filter 3 is grounded, this embodiment can further effectively avoid a reliability problem on the target module 11, for example, an electro-static discharge (ESD) problem.

Optionally, as shown in FIG. 4, the signal processing system further includes a second main board 9, and the second terminal of the band-stop filter 3 is electrically connected to a grounded member 10 on the second main board 9.

Optionally, the grounded member may be a grounded spring. Certainly, the grounded member may be alternatively in other structural forms, which are not listed one by one herein.

It should be noted that the second main board 9 and the first main board above may be a same main board in the terminal device.

In this embodiment, the second terminal of the band-stop filter 3 is electrically connected to the grounded member on the second main board 9, which is equivalent to implementing grounding of the second terminal of the band-stop filter 3 by using the grounded member on the second main board 9. Because the band-stop filter 3 is electrically connected between the metal frame 13 and the grounded member on the second main board 9, even if the target module 11 outputs, by using a conductive action of the metal frame 13, the display signal (or the camera signal) used as the noise, the noise is greatly weakened, and it is difficult for the noise to cause interference to the radio frequency signal on the second main board 9. The radio frequency signal on the second main board 9 may include a global positioning system (GPS) signal.

It can be learned that, in this embodiment, interference caused by the interference source 1 to the second main board 9 can be effectively avoided.

Figure 5:
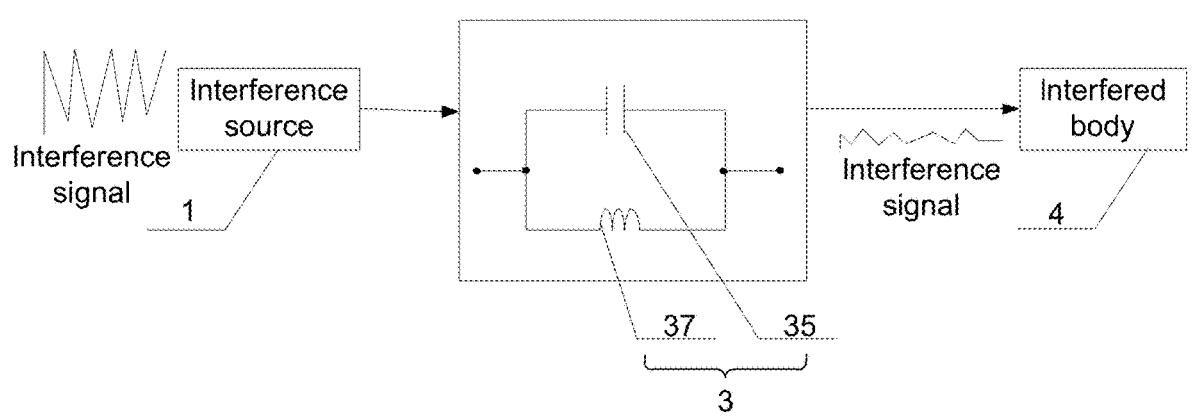
FIG. 5 is a schematic structural diagram 4 of a signal processing system according to an embodiment of the present disclosure.

Optionally, as shown in FIG. 4 and FIG. 5, the band-stop filter 3 includes a second capacitor 35 and a second inductor 37. A first terminal (an upper terminal d shown in FIG. 4) of the second capacitor 35 is electrically connected to the metal frame 13, and a second terminal (a lower terminal shown in FIG. 4) of the second capacitor 35 is electrically connected to the grounded member 10. The second inductor 37 is connected in parallel to the second capacitor 35.

It can be easily learned from FIG. 4 that an upper terminal of the second capacitor 35 and an upper terminal of the second inductor 37 jointly constitute the first terminal of the band-stop filter 3, and a lower terminal of the second capacitor 35 and a lower terminal of the second inductor 37 jointly constitute the second terminal of the band-stop filter 3.

Optionally, cut-off frequency of the band-stop filter 3 may be calculated by using the following formula:

$$F = \frac{1}{2\pi\sqrt{LC}}.$$

F is the cut-off frequency of the band-stop filter 3, L is an inductance value of the second inductor 37, and C is a capacitance value of the second capacitor 35.

Therefore, by selecting the second inductor 37 with a proper inductance value and the second capacitor 35 with a proper capacitance value, the band-stop filter 3 can effectively act on the display signal or the camera signal that is used as the noise. In specific implementation, the inductance value of the second inductor 37 is greater than or equal to 1 nH and less than or equal to 200 nH, and the capacitance value of the second capacitor 35 is greater than or equal to 0.1 pF and less than or equal to 100 pF.

The inductance value of the second inductor 37 may be 1 nH, 50 nH, 100 nH, 150 nH, or 200 nH, and the capacitance value of the second capacitor 35 is 0.1 pF, 1 pF, 10 pF, 50 pF, or 100 pF. Certainly, the inductance value of the second inductor 37 and the capacitance value of the second capacitor 35 are not limited to the foregoing enumerated cases. The inductance value of the second inductor 37 and the capacitance value of the second capacitor 35 may be properly selected based on an actual requirement. It is only required to ensure that the band-stop filter 3 can effectively act on the display signal or the camera signal that is used as the noise. Cases are not listed one by one herein.

It can be learned that, in this embodiment, for the baseband signal such as the display signal or the camera signal, the band-stop filter 3 is added, so that the noise can be effectively prevented from being conducted to the interfered body 4 through conduction, thereby effectively weakening interference to the interfered body 4, and effectively ensuring normal running of the interfered body 4.

In summary, compared with a related technology, this embodiment can effectively resolve an interference problem.

A terminal device provided in an embodiment of the present disclosure is described below.

An embodiment of the present disclosure further provides a terminal device, and the terminal device includes the foregoing signal processing system. For a specific implementation process of the signal processing system, refer to the foregoing descriptions. This is not limited in this embodiment of the present disclosure.

Because the signal processing system has the foregoing technical effect, the terminal device that has the signal processing system also has a corresponding technical effect, and details are not described herein again.

The embodiments of the present disclosure are described with reference to the accompanying drawings above. However, the present disclosure is not limited to the foregoing specific implementations. The foregoing specific implementations are merely exemplary, but are not limiting. A person of ordinary skill in the art may make many forms without departing from the objective and the scope of the claims of the present disclosure.

What is claimed is:

1. A signal processing system, applied to a terminal device and comprising:
    an interference source; and
    a band-stop filter, wherein a first terminal of the band-stop filter is electrically connected to the interference source, a second terminal of the band-stop filter is grounded, and the band-stop filter is configured to filter a baseband signal output by the interference source; wherein
    the interference source comprises a target module and a metal frame used for fastening the target module, and the target module is a display module; the first terminal of the band-stop filter is electrically connected to the metal frame, and the band-stop filter is configured to filter a display signal that is output by the metal frame.

2. The signal processing system according to claim 1, wherein the signal processing system further comprises:
    a second main board, wherein a second terminal of the band-stop filter is electrically connected to a grounded member on the second main board.

3. The signal processing system according to claim 2, wherein the band-stop filter comprises:
    a second capacitor, wherein a first terminal of the second capacitor is electrically connected to the metal frame, and a second terminal of the second capacitor is electrically connected to the grounded member; and
    a second inductor, wherein the second inductor is connected in parallel to the second capacitor.

4. The signal processing system according to claim 3, wherein
    an inductance value of the second inductor is greater than or equal to 1 nH and less than or equal to 200 nH; and
    a capacitance value of the second capacitor is greater than or equal to 0.1 pF and less than or equal to 100 pF.

5. A terminal device, comprising a signal processing system, wherein the signal processing system comprises:
    an interference source; and
    a band-stop filter, wherein a first terminal of the band-stop filter is electrically connected to the interference source, a second terminal of the band-stop filter is grounded, and the band-stop filter is configured to filter a baseband signal output by the interference source; wherein
    the interference source comprises a target module and a metal frame used for fastening the target module, and the target module is a display module; the first terminal of the band-stop filter is electrically connected to the metal frame, and the band-stop filter is configured to filter a display signal that is output by the metal frame.

6. The terminal device according to claim 5, wherein the signal processing system further comprises:
    a second main board, wherein a second terminal of the band-stop filter is electrically connected to a grounded member on the second main board.

7. The terminal device according to claim 6, wherein the band-stop filter comprises:
    a second capacitor, wherein a first terminal of the second capacitor is electrically connected to the metal frame, and a second terminal of the second capacitor is electrically connected to the grounded member; and
    a second inductor, wherein the second inductor is connected in parallel to the second capacitor.

8. The terminal device according to claim 7, wherein
    an inductance value of the second inductor is greater than or equal to 1 nH and less than or equal to 200 nH; and
    a capacitance value of the second capacitor is greater than or equal to 0.1 pF and less than or equal to 100 pF.

* * * * *